(12) United States Patent
Monsma et al.

(10) Patent No.: US 6,515,897 B1
(45) Date of Patent: Feb. 4, 2003

(54) MAGNETIC RANDOM ACCESS MEMORY USING A NON-LINEAR MEMORY ELEMENT SELECT MECHANISM

(75) Inventors: Douwe Johannes Monsma, Los Gatos, CA (US); Stuart Stephen Papworth Parkin, San Jose, CA (US); Roy Edwin Scheuerlein, Cupertino, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/549,211

(22) Filed: Apr. 13, 2000

(51) Int. Cl.$^7$ .............................................. G11C 11/15
(52) U.S. Cl. ........................ 365/173; 365/145; 365/171
(58) Field of Search ................................ 365/171, 173, 365/145

(56) References Cited

U.S. PATENT DOCUMENTS

| | | | | |
|---|---|---|---|---|
| 5,541,868 A | | 7/1996 | Prinz ............................ 365/98 |
| 5,640,343 A | | 6/1997 | Gallagher et al. ........... 365/171 |
| 5,695,864 A | | 12/1997 | Slonczewski ................ 428/212 |
| 5,734,605 A | | 3/1998 | Zhu et al. .................... 365/173 |
| 5,877,511 A | * | 3/1999 | Tanamoto et al. ............ 257/30 |
| 5,991,193 A | * | 11/1999 | Gallagher et al. ........... 365/171 |
| 6,130,835 A | * | 10/2000 | Scheuerlein ................. 365/171 |

* cited by examiner

*Primary Examiner*—Son T. Dinh
(74) *Attorney, Agent, or Firm*—Thomas R. Berthold, Esq.; Banner & Witcoff, Ltd.

(57) ABSTRACT

A non-volatile memory array having a substrate, a first plurality of electrically conductive traces formed on the substrate, a second plurality of electrically conductive traces formed on the substrate and overlapping first plurality of traces at a plurality of intersection regions, and a plurality of memory cells. Each memory cell is located at an intersection region between one of the first plurality of traces and one of the second plurality of traces. At least one memory cell includes a non-linear magnetic tunnel junction storage element. The non-linear magnetic tunnel junction storage element has at least a first ferromagnetic layer, a barrier layer and a second ferromagnetic layer. The non-linear magnetic tunnel junction storage element has a non-linearity that is defined by a current having a first magnitude flowing through the non-linear magnetic tunnel junction storage element for a bias across the non-linear magnetic tunnel junction storage element of about 0.5 $V_A$ that is ten times or more smaller than a current having a second magnitude flowing through the non-linear magnetic tunnel junction storage element for a bias across the non-linear magnetic tunnel junction storage element of about 1 $V_A$, where $V_A$ is an operating voltage for a memory cell. The non-linearity is used for minimizing sneak currents through unselected cells, and allowing read or write selection of a particular memory element in a large array.

32 Claims, 8 Drawing Sheets

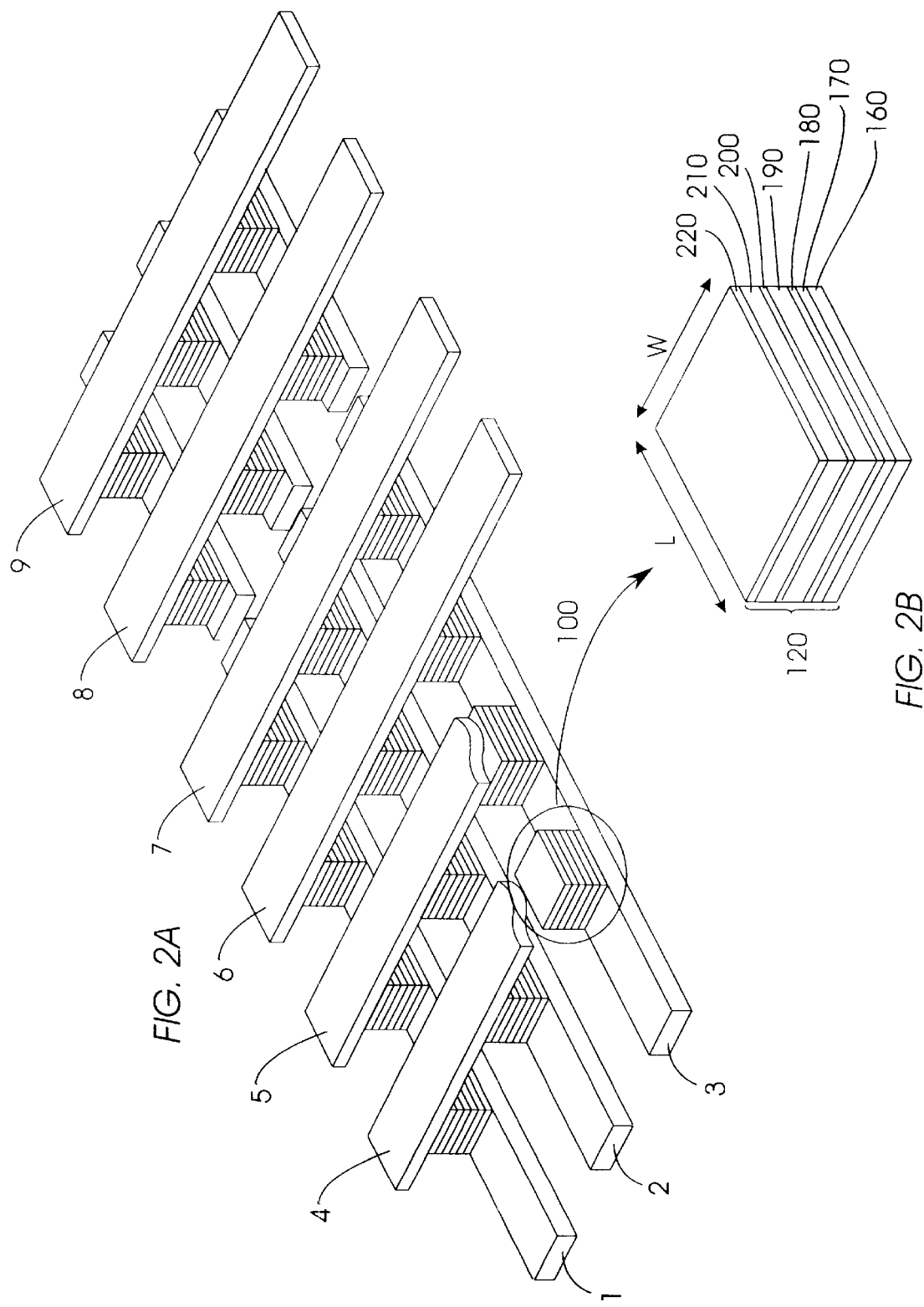

MAGNETIC RANDOM ACCESS MEMORY USING A NON-LINEAR MEMORY ELEMENT SELECT MECHANISM

CROSS REFERENCE TO RELATED APPLICATIONS

The present application is related to U.S. patent application Ser. No. 09/549,171, entitled "Magnetic Random Access Memory Using Current Through MTJ Mechanism," invented by D. J. Monsma et al., and U.S. patent application Ser. No. 09/549,172, entitled "Magnetic Random Access Memory Using A Series Tunnel Element Select Mechanism," invented by D. J. Monsma et al., both of which were filed concurrently with the present application, and each of which is incorporated by reference herein.

BACKGROUND OF THE INTENTION

1. Field of the Invention

The present invention relates generally to the field of nonvolatile memory devices for use in computers and other devices. More particularly, the present invention relates to nonvolatile memory arrays that use magnetic tunnel junction memory elements as individual memory cells.

2. Description of the Related Art

Certain types of magnetic memory cells that use the magnetic state of a ferromagnetic region for altering the electrical resistance of materials located near the ferromagnetic region are collectively known as magnetoresistive (MR) memory cells. An array of magnetic memory cells is often called a magnetic random access memory (MRAM).

In comparison to metallic MR memory cells, which are based on giant magnetoresistance (GMR) or anisotropic magnetoresistance (AMR) devices, MRAM memory cells are based on magnetic tunnel junction (MTJ) devices and rely on substantially different physical principles. For example, GMR devices include at least two ferromagnetic layers that are separated by a thin metallic layer. In contrast, an MTJ device has two ferromagnetic layers that are separated by a thin insulating tunnel barrier. The magnetoresistance of an MTJ device results from a spin-polarized tunneling of conduction electrons between the two ferromagnetic layers that depends on the relative orientation of the magnetic moments of the two ferromagnetic layers.

FIG. 1A shows a portion of a conventional MRAM array that uses conventional magnetoresistive memory cells, such as disclosed by U.S. Pat. No. 5,640,343 to Gallagher et al. (the Gallagher '343 patent). The MRAM array shown in FIG. 1A includes a set of electrically conductive traces 1–3 in a horizontal plane that function as parallel word lines and a set of electrically conductive traces 4–9 in another horizontal plane that function as parallel bit lines. The word lines are oriented in a different direction from the bit lines, preferably at a right angle, so that the two sets of lines intersect when viewed from above. The MRAM array of FIG. 1A is referred to as a cross point array because memory cells are placed at the intersection point of crossing lines. The CAM array of FIG. 1A is formed on a substrate (not shown), such as a silicon, on which there would be other circuitry (also not shown). For clarity, a layer of insulative material that is located between the bit lines and word lines within the MRAM other than the intersecting regions is not shown. While three word lines and six bit lines are illustrated in FIG. 1A, the total number of lines is typically much larger.

A conventional memory cell 10 is located at each crossing point of the word lines and bit lines within an intersection region that is vertically spaced between the respective sets of lines. FIG. 1B shows an enlarged view of a conventional magnetoresistive memory cell 10. Memory cell 10 includes a vertical stack of a diode-like selection device 11, e.g., a silicon junction diode, connected electrically in series with a magnetic tunnel junction (MTJ) device 12. Memory cell 10 can be fabricated very densely because the cell has only two terminals and has a vertical current path through selection device 11 and MTJ 12.

Selection device 11 is a silicon junction diode that is formed from an n-type silicon layer 13 and a p-type silicon layer 14. The n-type silicon layer 13 is formed on and connected to word line 3. The p-type silicon layer 14 is connected to the MTJ 12 via a tungsten stud 15. MTJ 12 is formed from a series of layers of material that are stacked one on top of the other. MTJ 12 includes a template layer 16, such as Pt, an initial ferromagnetic layer 17, such as permalloy (Ni—Fe), an antiferromagnetic layer (AF) 18, such as Mn—Fe, a fixed ferromagnetic layer (FMF) 19, such as Co—Fe or permalloy, a thin tunneling barrier layer 20 of alumina ($Al_2O_3$), a soft ferromagnetic layer (FMS) 21, such as a sandwich of thin Co—Fe with permalloy, and a contact layer 22, such as Pt. Additional details regarding conventional memory cell 10 are provided in U.S. Pat. No. 5,640,343 to Gallagher et al., which is incorporated by reference herein.

Diode 11 is necessary for preventing currents from flowing through alternate current paths, referred to herein as sneak currents. For instance, if in FIG. 1A, word line 2 is grounded and a bias of $V_A$ is applied to bit line 7, a signal current will flow through the selected cell (in this case the cell connecting word line 2 and bit line 7, referred to herein as cell 2,7). A very small current will flow through alternate paths, for example, via cells 2,6, 3,6 and 3,7 because the diode in cell 3,6 is reverse biased. The reverse currents for all of the unselected diodes in the memory matrix contribute to the total sneak current. In order to maintain the signal current to be of the same order of magnitude as the total sneak current for an n×n matrix, the rectification ratio of the selected diode must be greater than $n^2$. Such a requirement for a diode requires a device-quality semiconducting diode material, which cannot easily be grown on top of a metallic word line, and implies that the diode will have a high resistance.

Additionally, the resistance of the diode, and more particularly the differential resistance of the diode, should be less than the resistance of the MTJ device so that sensing circuitry can easily detect changes in resistance of the MTJ device that represent the different states of the MTJ device. Thus, a large diode resistance implies a correspondingly large MTJ resistance so that MTJ device resistance changes can be easily detected. A high overall diode and MTJ resistance results in slow performance caused by RC delays, in addition to limited power levels during a sensing operation. Thus, a drawback associated with the Gallagher '343 memory cell is the high resistance of the diode between the two metal layers.

U.S. Pat. No. 5,734,605 to Zhu et al. discloses an alternative conventional MRAM cell that uses a transistor as a selection element for a memory cell. The Zhu et al. MRAM cell uses more space than a cross point cell because the cell has more than two terminals. Moreover, the cell must have a connection from the MTJ to the silicon surface where the transistor is located. The transistor also occupies more area than the tunnel junction occupies.

A very small, 2×2 MTJ element array is disclosed by Z. G. Wang et al. in Spin Tunneling Random Access Memory, IEEE Transactions on Magnetics, Vol. 32 No. 5, 1996, pp. 4022–4024. Although individual cells in the disclosed 2×2 array can be read without diodes, the non-linearity in these standard $Al_2O_3$ MTJs is insufficient for permitting selection in arrays that are larger than 2×2 without significantly increasing the time to read a memory cell. Moreover, arrays having a 2×2-array size are too small to be of technological use because the support circuitry would form too large an area on a chip, thereby making the storage density much too small.

To overcome the very small overall MRAM array size of Wang et al., U.S. patent application Ser. No. (Atty Docket No. AM9-99-0112) to Monsma et al. discloses an MTJ cell that uses a tunneling device having a non-linear current dependence through the device as a function of bias voltage. According to Monsma et al., amorphous or polycrystalline barriers are used for forming a non-linear tunnel selection device, such as a metal-barrier-metal (MBM) device, that is fabricated in series with the MTJ to form an MBM-MTJ memory cell. The voltage drop across an unselected MBM is $V_{mbm,u} = 0.5V_A$, with $V_A$ being the applied bias voltage used for selecting a cell. The voltage drop across a selected MBM is $V_{mbm,s} = V_A - V_{mtj}$, with $V_{mtj}$ being the voltage drop across the selected MTJ (about 0.2 V). Consequently, the difference in voltage drop across a selected MBM and an unselected MBM is $0.5V_A - V_{mtj}$, and not $0.5V_A$. Moreover, when a current through the MTJ device is used for writing or for assisting in writing the MTJ device, device selection is limited by a relatively large voltage drop across the MTJ device, thereby resulting in a total current that is more than twice the write current through a single cell. Additionally, the large voltage drop across the MTJ device results in an excessive power consumption.

What is needed is an MTJ memory cell having sufficient non-linearity for both reading and writing, in addition to having a lower and thicker barrier.

SUMMARY OF THE INVENTION

The present invention provides an MTJ memory cell having sufficient non-linearity for both reading and writing, in addition to having a lower and thicker barrier. The advantages of the present invention are provided by a non-linear magnetic tunnel junction storage element having a first ferromagnetic layer, a barrier layer, and a second ferromagnetic layer. According to the invention, the non-linear magnetic tunnel junction storage element has a non-linearity that is defined by a current having a first magnitude flowing through the non-linear magnetic tunnel junction storage element for a bias across the non-linear magnetic tunnel junction storage element of about 0.5 $V_A$ that is ten times or more smaller than a current having a second magnitude flowing through the non-linear magnetic tunnel storage element for a bias across the non-linear magnetic tunnel storage element of about 1 $V_A$, where $V_A$ is an operating voltage of the non-linear magnetic tunnel junction storage element. Preferably, the operating voltage $V_A$ is about 1.0 Volts. The barrier layer of the non-linear magnetic tunnel storage element is one of an insulating or a semiconducting layer. When the barrier layer is an insulating layer, the insulating barrier layer in combination with the first and second ferromagnetic layers, has a barrier height that is less than about 1 eV. The non-metallic insulating layer can be formed from aluminum arsenide. When the barrier layer is formed from a semiconducting layer, the semiconducting material layer, in combination with the first and second ferromagnetic layers, has a barrier height that is less than about 1 eV. The semiconducting material layer can be formed from silicon, germanium or an oxidic semiconductor, such as titanium dioxide or zinc oxide.

The present invention also provides a non-volatile memory array having a substrate, a first plurality of electrically conductive traces formed on the substrate, a second plurality of electrically conductive traces formed on the substrate and overlapping first plurality of traces at a plurality of intersection regions, and a plurality of memory cells. Each memory cell is located at an intersection region between one of the first plurality of traces and one of the second plurality of traces. At least one memory cell includes a non-linear magnetic tunnel junction storage element. The non-linear magnetic tunnel junction storage element has at least a first ferromagnetic layer, a barrier layer and a second ferromagnetic layer. According to the invention, the non-linear magnetic tunnel junction storage element has a non-linearity that is defined by a current having a first magnitude flowing through the non-linear magnetic tunnel storage element for a bias across the non-linear magnetic tunnel storage element of about 0.5 $V_A$ that is ten times or more smaller than a current having a second magnitude flowing through the non-linear magnetic tunnel storage element for a bias across the non-linear magnetic tunnel storage element of about 1 $V_A$, wherein $V_A$ is an operating voltage for a memory cell.

BRIEF DESCRIPTION OF THE DRAWING

The present invention is illustrated by way of example and not limitation in the accompanying figures in which like reference numerals indicate similar elements and in which:

FIG. 2A shows an MRAM array having magnetoresistive memory cells according to the present invention;

FIG. 2B shows an enlarged view of a preferred embodiment of a magnetoresistive memory cell 100 according to the present invention;

DETAILED DESCRIPTION

Figures 1A, 1B:
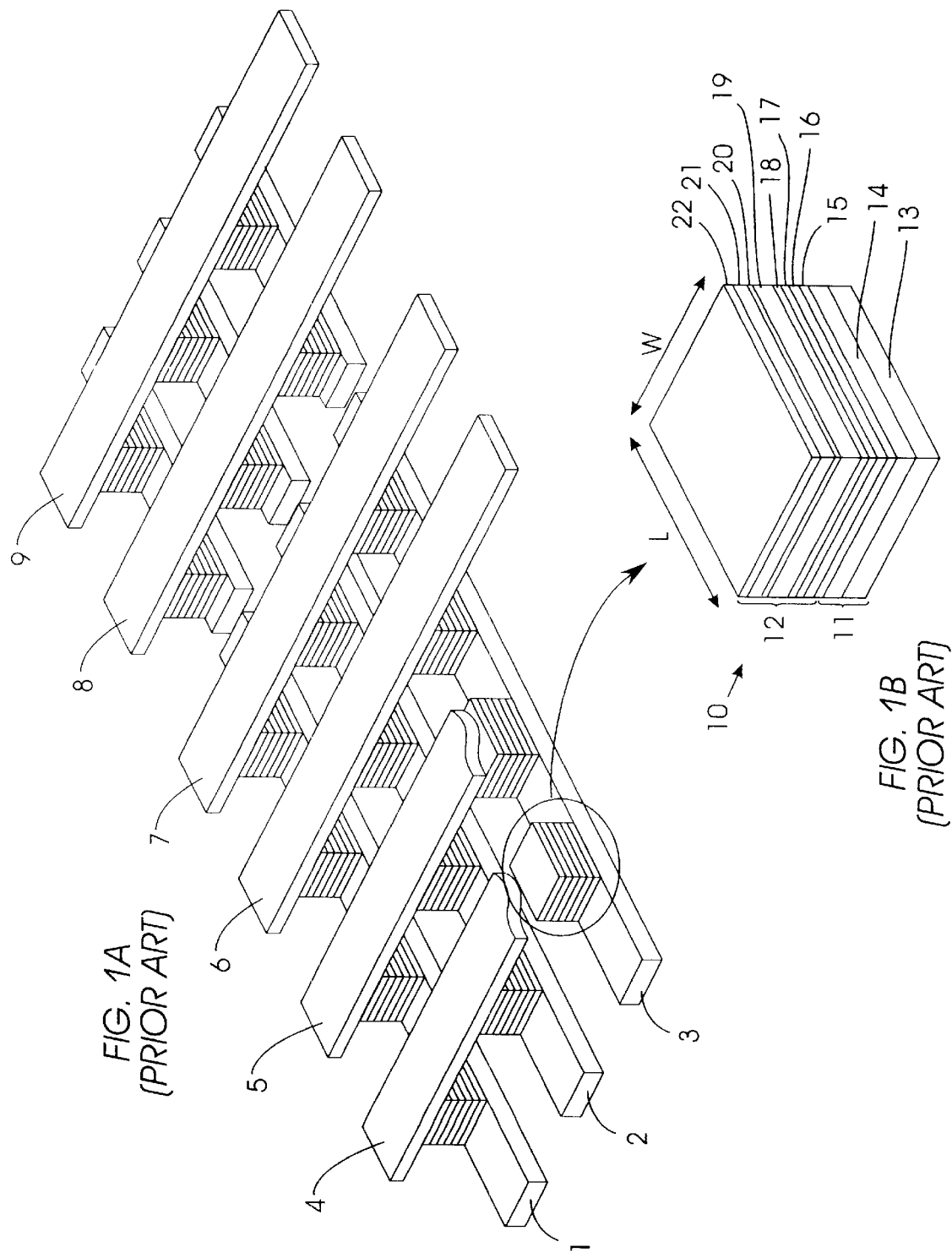
FIG. 1A shows a conventional MRAM array having magnetoresistive memory cells that are located between bit and word lines.
FIG. 1B shows an enlarged view of a conventional magnetoresistive memory cells of the conventional MRAM shown in FIG. 1A.

The present invention provides an MRAM array having MTJ memory cells. Each memory cell is formed from a single MTJ having a strongly non-linear I-V characteristic. No selection device, such as a FET, diode or MBM, is used series with the MTJ. Thus, for the diode especially, this eliminates variations in the total resistance of a memory cell that are caused by temperature fluctuations. The non-linearity of the MTJ is defined by a half bias/full bias current ratio (HFCR) that is less than 0.1, with full bias equal to 1 V, and is realized by using barrier materials in combination with ferromagnetic electrodes that yield low barrier heights that are on the order of about 0.5 eV. An MTJ having such a low barrier height has sufficient magnetoresistance for distinguishing the written magnetic bit state (high or low resistance) of the MTJ.

The relatively low barrier height of the MTJ of the present invention provides an additional advantage for writing of the magnetic state of the MTJ using, or assisted, by a current through an MTJ. Because there is no resistance associated with a series selection device, no corresponding voltage drop appears across such a series selection device. Moreover, the resistance of the MTJ of the present invention becomes lower for higher biases, in contrast to the resistance of a linear MTJ or that of a series FET selection device, which hardly changes with changing bias. Consequently, the write current through the MTJ can be relatively large without dissipating a correspondingly high power. Additionally, the write selection for the single MTJ memory cell of the present invention is significantly improved in contrast to that of an MBM-MTJ memory cell. That is, the voltage drop across an unselected MTJ memory cell of the present invention is half the voltage drop across a selected MTJ memory cell. In contrast, the voltage drop across an unselected MBM, the selection device of an MBM-MTJ memory cell, is only half of the bias voltage appearing across the entire unselected MBM-MTJ memory cell. Another advantage of the present invention is the use of a thicker barrier that improves yield and decreases magnetic interactions between magnetic layers adjacent to the insulating layer. This results in lower and more reproducible switching fields.

FIG. 2A shows an MRAM array having magnetoresistive memory cells according to the present invention. The MRAM array shown in FIG. 2A includes a set of electrically conductive traces 1–3 in a horizontal plane that function as parallel word lines and a set of electrically conductive traces 4–9 in another horizontal plane that function as parallel bit lines. The word lines are oriented in a different direction from the bit lines, preferably at a right angle, so that the two sets of lines intersect when viewed from above. A memory cell 100 is located at each crossing point of the word lines and bit lines within an intersection region that is vertically spaced between the respective sets of lines.

FIG. 2B shows an enlarged view of a preferred embodiment of a magnetoresistive memory cell 100 according to the present invention. Memory cell 100 is formed from an MTJ 120 having a strongly non-linear I-V characteristic by using a specific thickness and barrier height for the barrier material. No selection device, such as a FET, diode or MBM, is used in series with MTJ 120. Each MTJ memory cell of the MRAM array of FIG. 2A is arranged vertically at the intersection regions of the two lines and between the two lines, thereby minimizing the total MRAM surface area of the MRAM.

MTJ 120 is formed from a series of layers of material that are stacked one on top of the other. MTJ 120 includes a template layer 160, such as Pt, an initial ferromagnetic layer 170, such as permalloy (Ni—Fe), an antiferromagnetic layer (AF) 180, such as Mn—Fe, a fixed ferromagnetic layer (FMF) 190, such as Co—Fe or permalloy, a thin tunneling barrier layer 200, a soft ferromagnetic layer (FMS) 210, such as a sandwich of thin Co—Fe with permalloy, and a contact layer 220, such as Pt. Preferably, tunneling barrier layer is chosen, in combination with the neighboring ferromagnetic electrodes, to have a tunneling barrier height of about 0.5 eV.

Figure 3:
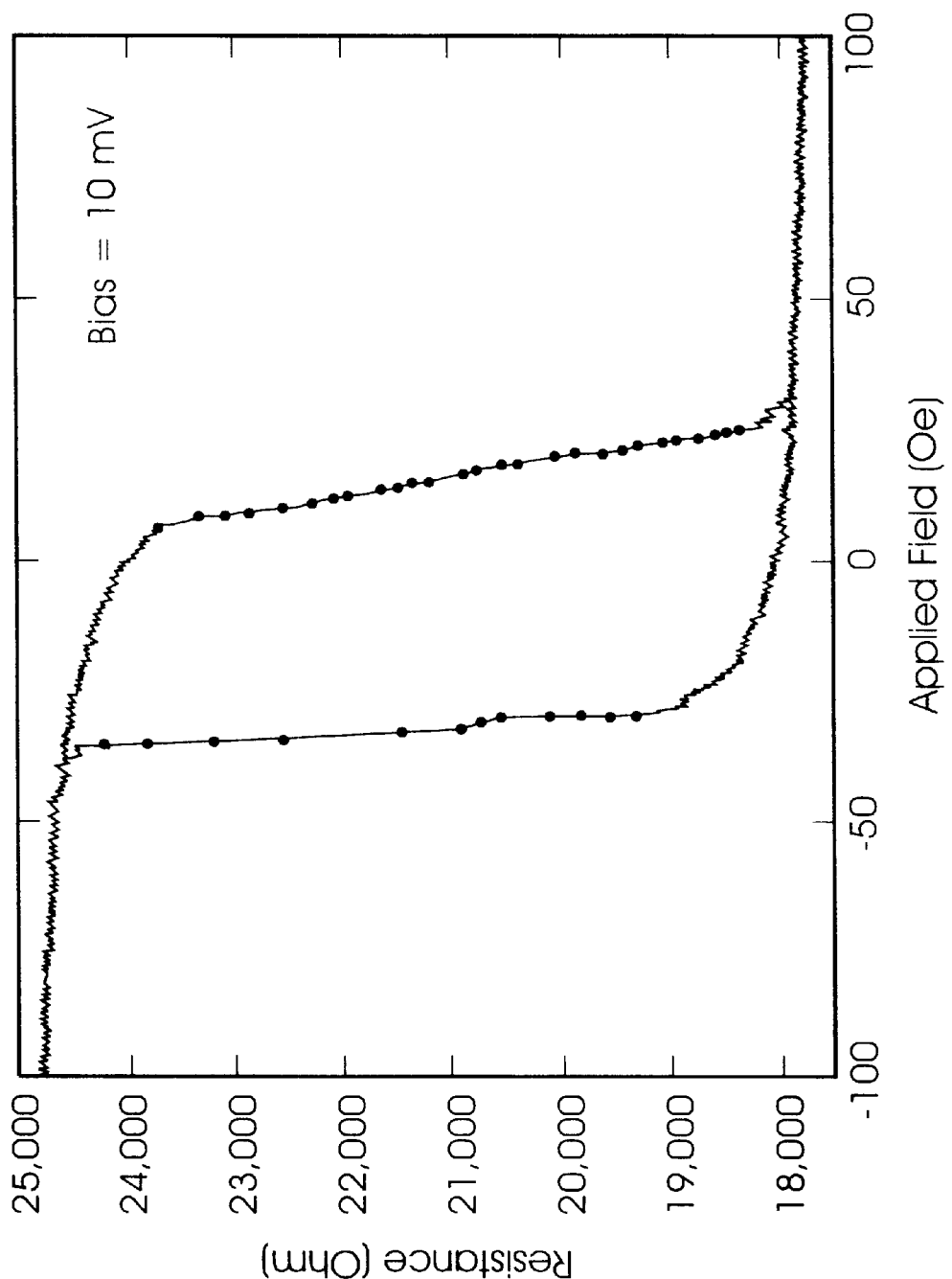
FIG. 3 is a graph showing the resistance change as a function of an applied field for an MTJ device.

FIG. 3 is a graph showing the resistance change as a function of an applied field for an MTJ having an $Al_2O_3$ barrier formed on a $SiO_2$ substrate, and comprised of layers of 50 Å Ti | 150 Å Pd | 160 Å IrMn(78) | 24 Å CoFe(80/20) | 18 Å Al plasma oxidized for 240 seconds | 3 Å CoFe(40/60) | 97 Å CoFe(80/20) | 200 Å Pd.

The experimental results of I-V characteristic measurements for a conventional MTJ having an $Al_2O_3$ barrier material show a large barrier height (2–2.5 eV).

Figure 4:
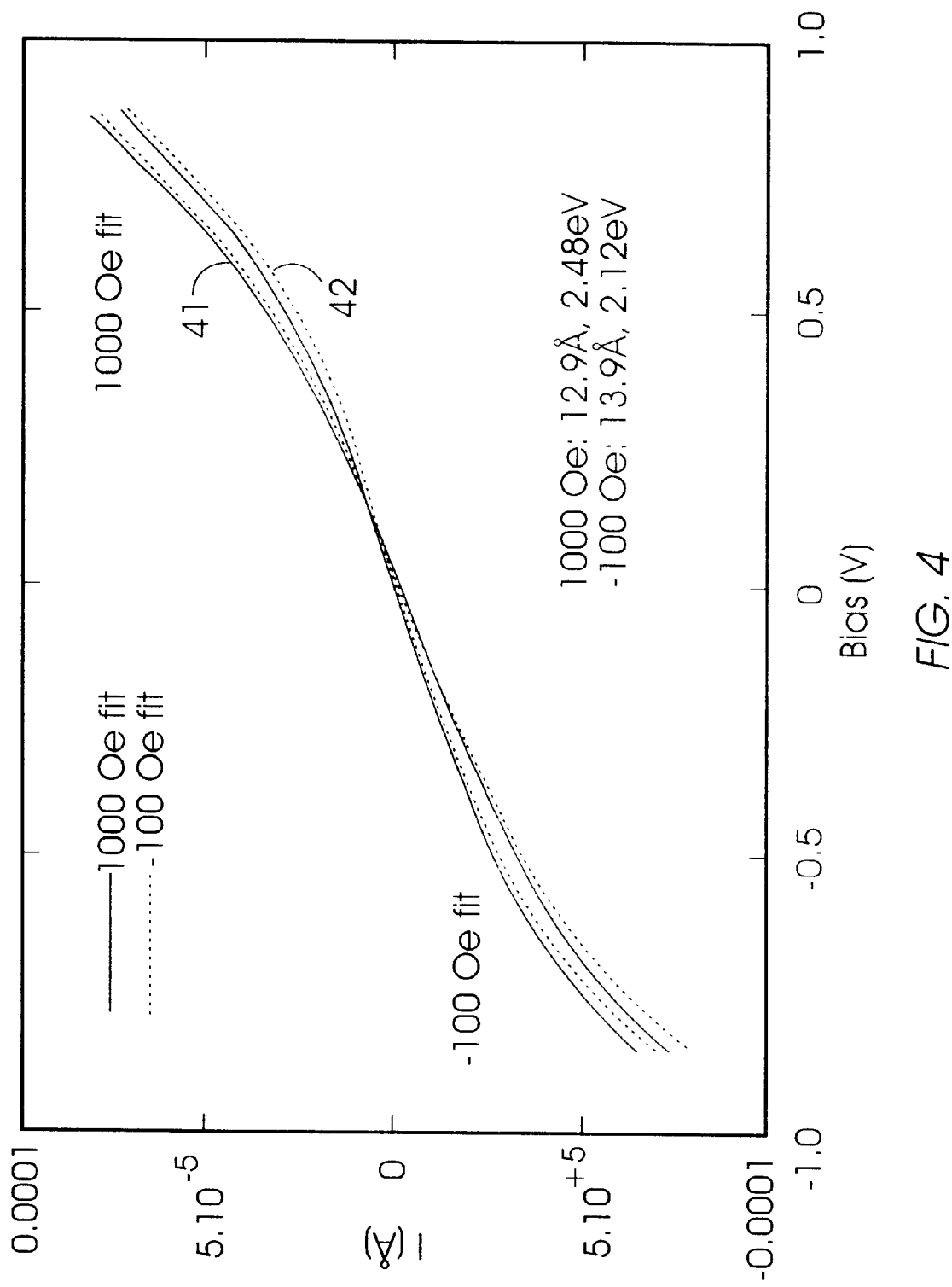
FIG. 4 is a graph showing experimental I-V characteristics of an MTJ at field strengths of 1000 Oe and –100 Oe.

FIG. 4 is a graph showing experimental I-V characteristics of an MTJ having a barrier thickness on the order of 14 Å for field strengths of 1000 Oe and −100 Oe. Curve 41 shows I-V characteristics for a field strength of 1000 Oe and curve 42 shows I-V characteristics for a field strength of −100 Oe. The data in FIG. 4 has been fitted using Simmons' theory, as disclosed by J. G. Simmons, J. Appl. Phys. Vol. 35 (1964), p. 2655. The I-V curves of FIG. 4 are only slightly non-linear. The half bias/full bias current ratio (HFCR) is approximately 0.5. For sub-micron sized junctions, as expected for a memory array, the resistance of each element must be on the order of 100–1000 Ω. A barrier thickness of 7 Å and an $Al_2O_3$ barrier height of 1.7 eV are appropriate for such dimensions. The calculation of the IV characteristic curves for an MTJ having a tunneling barrier layer with these parameters can be found in FIGS. 5A and 5B, represented by curves 51 and 52, respectively.

Figure 5A:
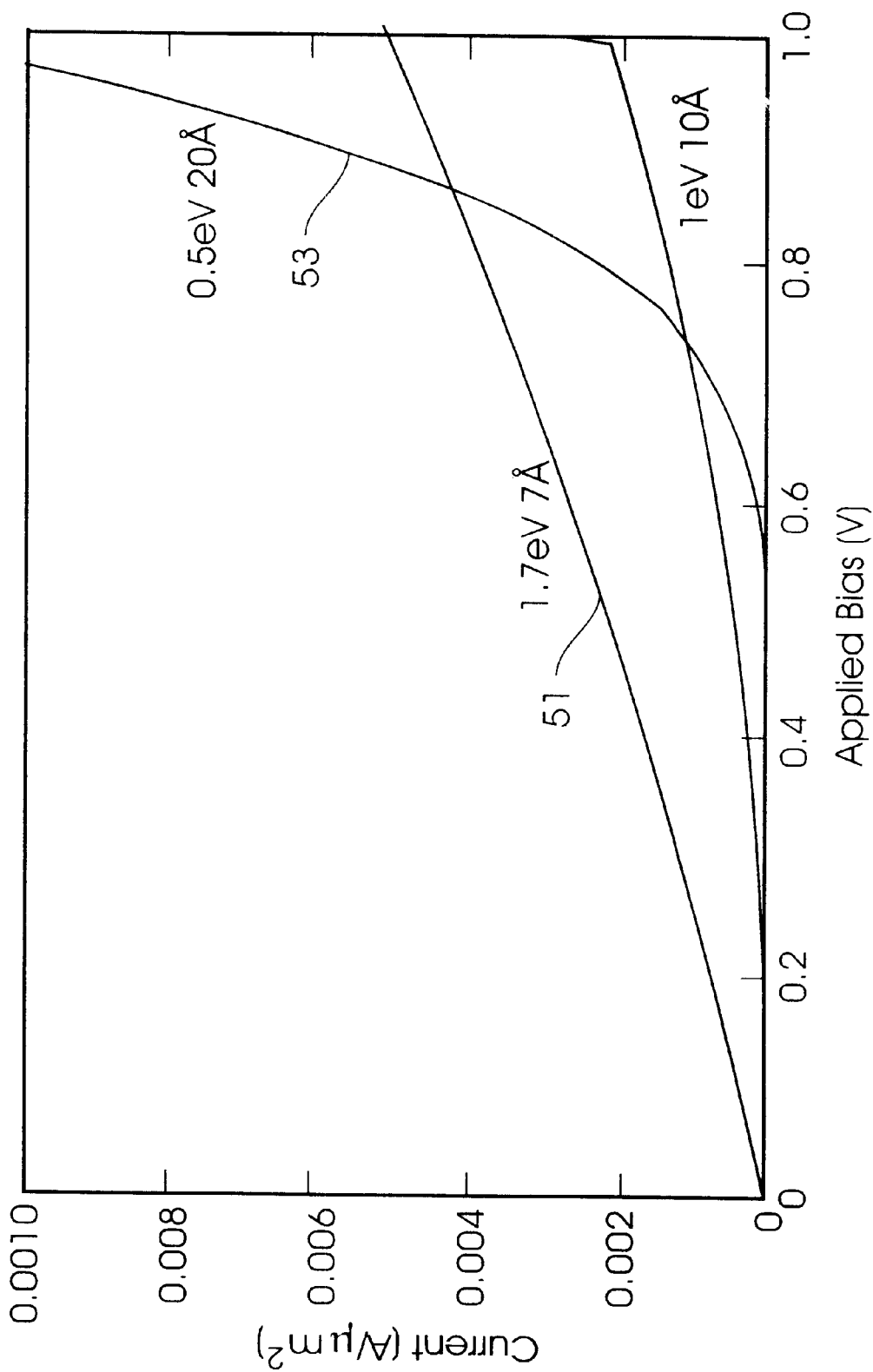
FIG. 5A is a graph showing a lin-lin representation of calculated current-voltage (I–V) characteristics for an MTJ and for an exemplary non-magnetic tunnel junction (TJ) functioning as an NLE.

FIG. 5A shows a graph of three calculated IV curves for MTJs having three different tunneling barriers with different tunneling barrier heights and tunneling barrier widths. Curve 51 shows a calculated current-voltage (I-V) characteristic for an MTJ having a tunneling barrier height of 1.7 eV and a thickness of 7 Å. Curve 53 shows a calculated I-V characteristic for an MTJ having a tunneling barrier height of 0.5 eV and a thickness of 20 Å Curves 51 and 53 are plotted in FIG. 5A using linear and voltage scales. These same current-voltage characteristics are plotted in FIG. 5B using a logarithmic current scale and a linear voltage scale as curves 52 and 54, respectively.

Figure 5B:
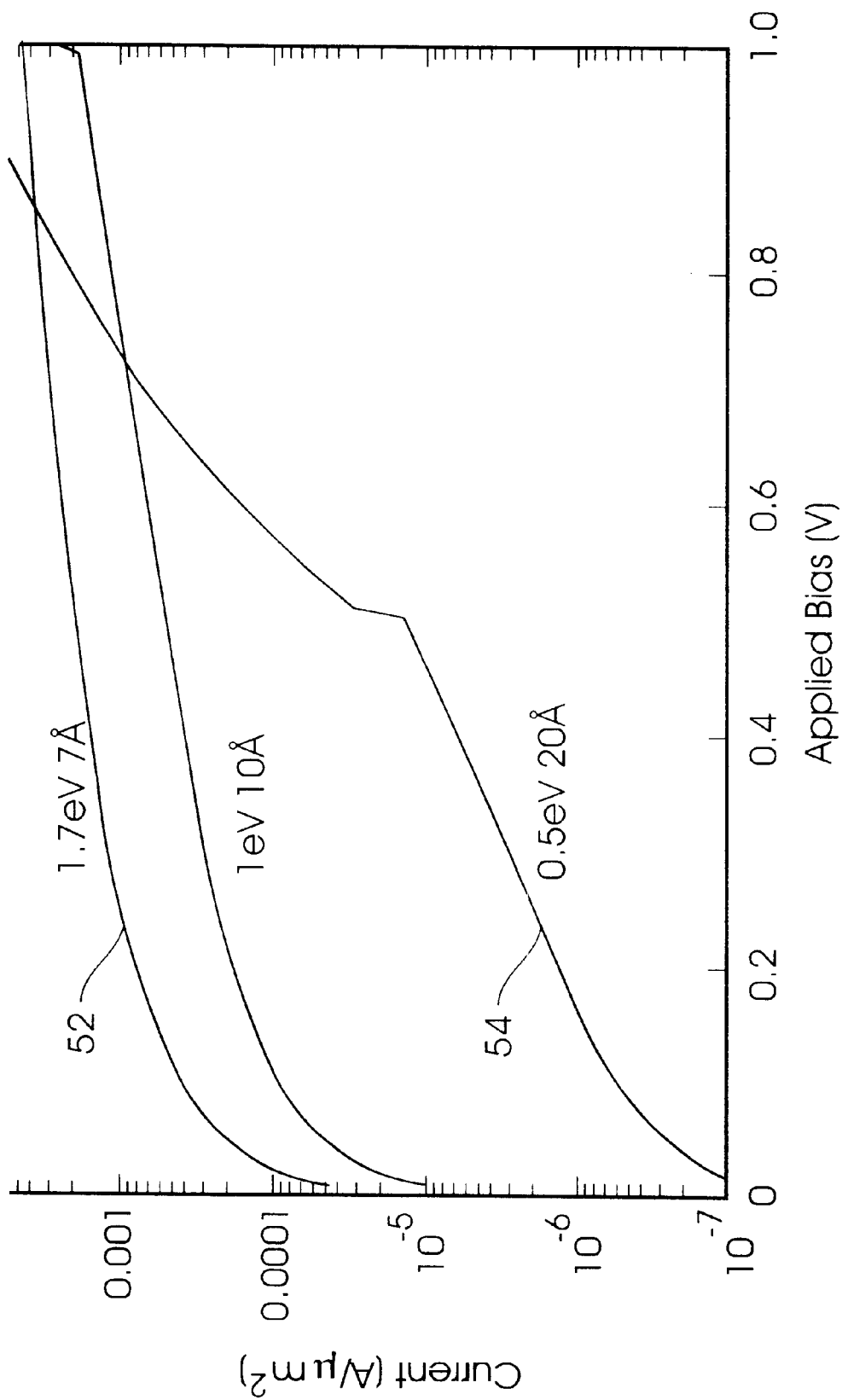
FIG. 5B is a graph showing a log-lin representation of the graph of FIG. 5A.
Figure 6A:
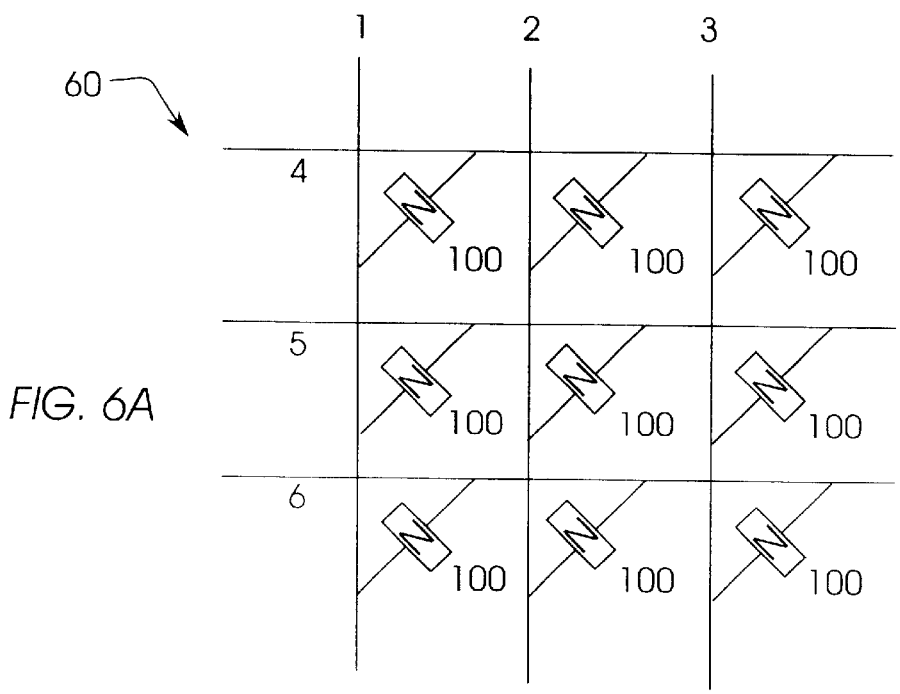
FIG. 6A is a schematic block diagram of an HAM array having a non-linear MTJ in each storage cell according to the present invention.
Figure 6B:
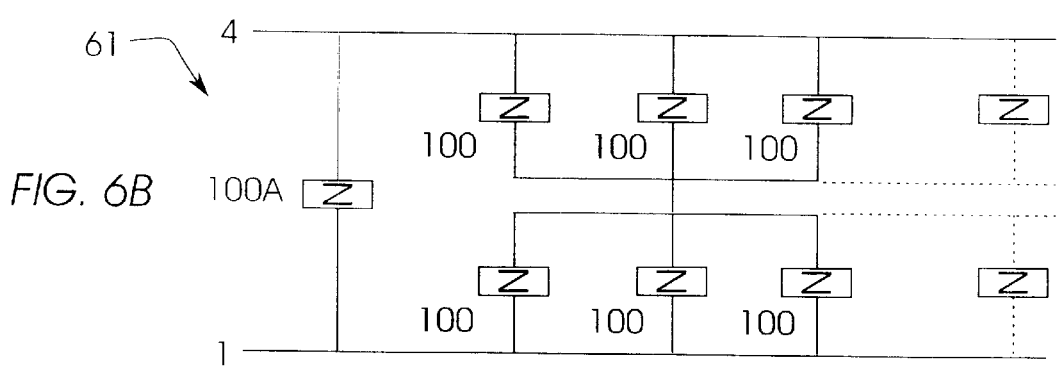
FIG. 6B is a schematic block diagram of an electrical equivalent circuit of the MRAM array of FIG. 6A.
Figure 6C:
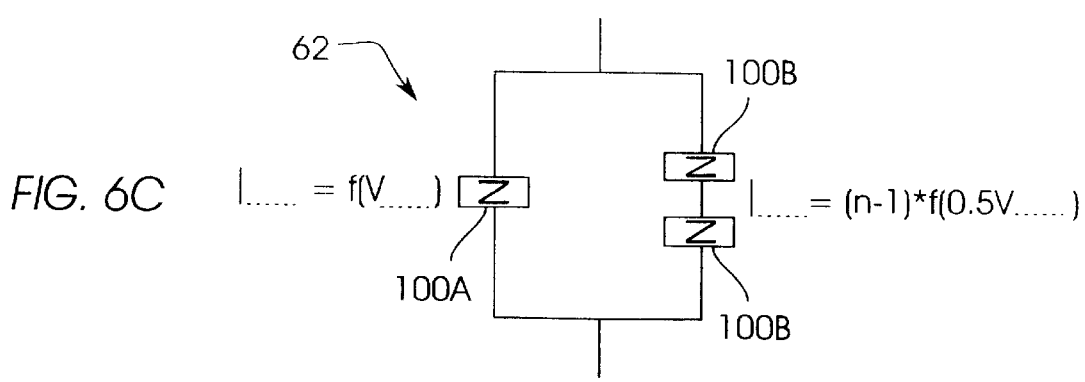
FIG. 6C is a further simplified schematic block diagram of an electrical equivalent circuit of the equivalent circuit of FIG. 6B.

For curves 51 and 52 in FIGS. 5A and 5B, respectively, the current through the MTJ scales almost linearly as a function of voltage across the MTJ. Consequently, if such an MTJ is put into a memory matrix as in FIG. 2A, the sneak current through the rest of the memory array will be about half of the signal current. This can be understood by considering FIGS. 6A–6C. FIG. 6A is a schematic block diagram of an MRAM array 60 having an MTJ forming each storage cell, such as shown in FIG. 2B. Word lines 1–3 are oriented perpendicularly from bit lines 4–6. A memory cell 100 is located at the intersection of the word and bit lines. FIG. 6B is a schematic block diagram of an electrical equivalent circuit 61 for MRAM array 60. Memory cell 100A represents a selected cell, while the rest of the memory cells are unselected. FIG. 6C is a further simplified schematic block diagram of an electrical equivalent circuit 62 for equivalent circuit 61 of FIG. 6B for determining signal current and total sneak current.

If, for example, word line 1 is high and bit line 4 low, the selected element is cell 1,4. Cell 1,4 is represented by cell 100A in FIG. 6C. The parallel resistance 100B is formed by n parallel MTJs connected to word line 1 that are in series with n parallel MTJs on bit line 4. The MTJs connected to the 2n MTJs are $n^2$ parallel MTJs and can be considered a short for large n (e.g., n=100). The total sneak current is then $(n-1)*I(at\ 0.5\ V_A)$. For a linear MTJ having resistance R, the total sneak resistance will be $2*R/(n-1)$, which for n>>1, yields 2R/n. The signal/sneak current ratio (SSCR) will be $(2R/n)/R=2/n$, which for n=100 yields a signal current that is 50 times smaller than the total sneak current. This is undesirable for reading of the bit state of the linear MTJ and because of power restrictions. Consequently, a diode was placed in series with each MTJ in a conventional MRAM or else arrays no larger than 2 by 2 could be sensed.

If, however, the MTJ is made so that the I-V characteristics of the MTJ are sufficiently non-linear, proper cell selection can be achieved without using a dedicated selection device. For example, curve 53 in FIG. 5A shows the I-V characteristic for a tunnel junction having a barrier height of 0.5 eV and a thickness of 20 Å. Curve 53 is highly non-linear because the barrier height is close to the regime of applied voltage. The greater thickness also contributes to the non-linearity. The SSCR for an MTJ having such non-linear I-V characteristics is useful for a memory array filled with such MTJs.

Accordingly, the SSCR will be $I(V_A)/nI(0.5V_A)$. For a bias $V_A=0.6$ V, the current $I(V_A)=0.2$ mA (see curve 54 in FIG. 5B). At half bias, the current will be $I(0.5V_A)=2\ \mu A$, so the SSCR=100/n. Consequently, for n=100, that is, a 100× 100 matrix, the total sneak current will be less than the signal current. For a 0.4 eV, 25 Å barrier, the total sneak current will be less than the signal current for a matrix as large as 1000×1000.

When the sneak current is less than signal current, the high or low value of the signal current can be detected even when the signal current is in combination with the sneak current. From a power consumption point of view, the half bias point is the minimal power dissipation for the sneak paths. Hence, the preferred embodiment of the present invention encompasses the application of an MTJ 120 formed by layers 160–220 having a non-linearity defined by an HFCR that is smaller than about 0.1.

The non-linearity is determined primarily by the thickness and barrier height of barrier material 200 and, as part of the preferred embodiment of this invention, can be formed from semiconducting and insulating materials, such as silicon, polysilicon, carbon, carbon nitride, $TiO_2$, BeO, $SnO_2$, etc. The thickness of barrier material 20 ranges from 5–25 Å and the barrier height ranges from 0.1–1 eV. The barrier height of a $TiO_2$ barrier depends on the metal electrodes surrounding the $TiO_2$ layer and can vary from ohmic (<0.2 eV) to about 1.2 eV depending upon the metal and preparation, as found in experimental Ti-$TiO_2$-Au diodes (ohmic for Ti-$TiO_2$ interface, 1.2 eV for $TiO_2$-Au interface. See, for example, R. Jerisian, Thin Solid Films, 115 (1984) 229. Based on R. Jerisian, it is possible to select the barrier height of an MTJ formed from, for example, Co-$TiO_2$-Co, to be in the range of 0.5 eV.

It is well known that the magnetoresistance of an MTJ decreases with applied bias. To reach an impedance level that is on the order of 1000 $\Omega \mu_2$ for a non-linear-MTJ having a relatively thicker barrier layer (which is required for a non-linear operation), it is desirable to operate the MTJ device at bias voltage that is greater 0.2 V. This particular bias voltage is the preferred bias voltage for the conventional MTJ disclosed in U.S. Pat. No. 5,640,343 to Gallagher et al. From FIG. 5B, the current for the 0.5 eV barrier at 0.2 V is only about 1 $\mu A$, which is a factor of 1000 too small.

Figure 7:
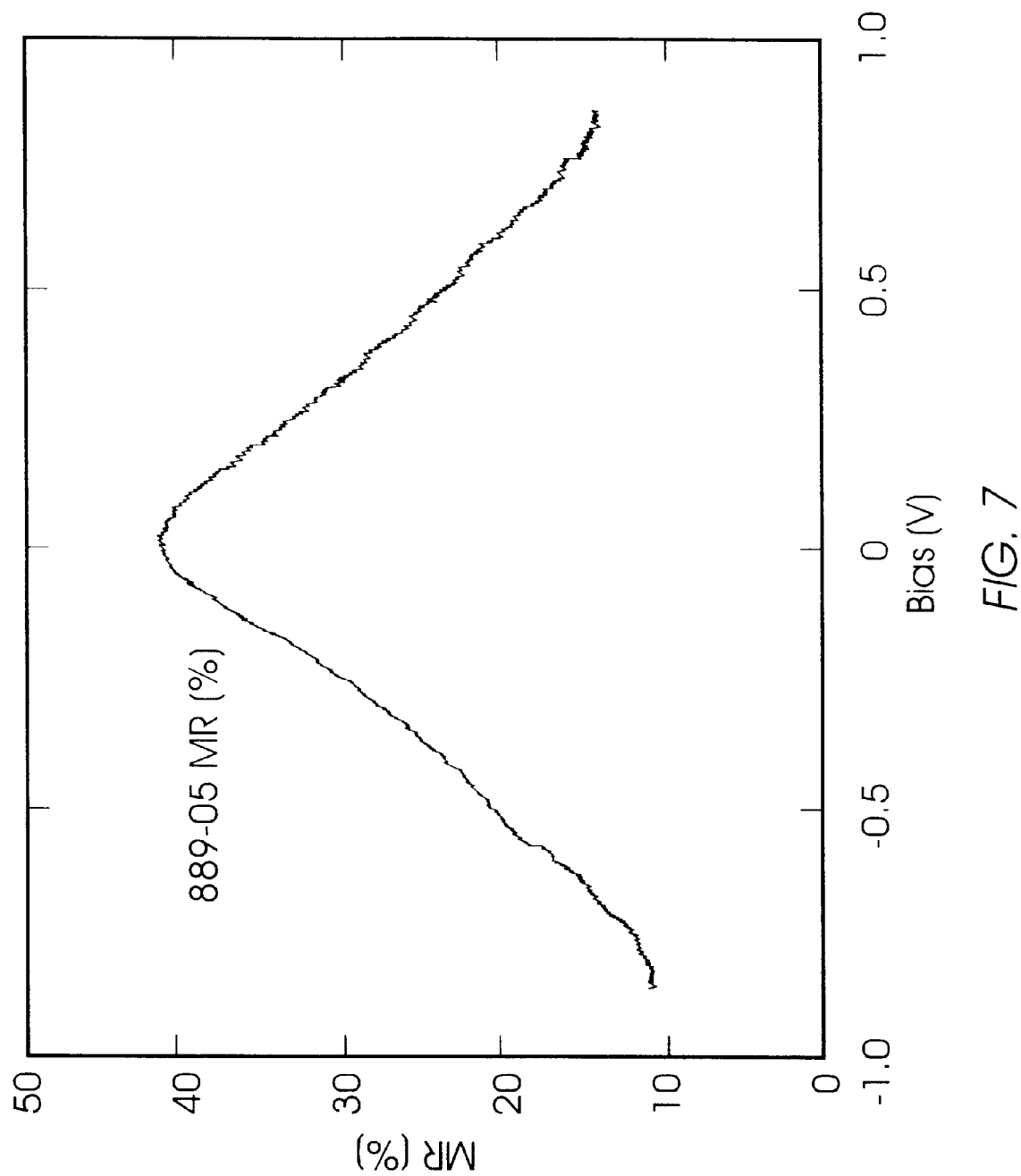
FIG. 7 is a graph showing the variation of MR(%) as a function of applied junction bias voltage for an exemplary non-linear MTJ.

Hence, for the barrier shown in FIG. 5A, a read bias of at least 0.6 V is desirable. Moreover, if the read bias is smaller, the HFCR will also decrease correspondingly. For example, for an applied read bias of 0.4 V, the current is 6 $\mu A$, and at half bias, this is $V_A=0.2V$, the current is 1 $\mu A$, so the HFCR is only 0.16. So for the present invention, a read operation is preferably performed at a bias voltage of at least 0.5 V. FIG. 7 is a graph showing the variation of MR(%) as a function of applied junction bias voltage for an exemplary non-linear MTJ. As can be seen in a plot of the measured magnetoresistance as a function of applied bias of an MTJ formed on a $SiO_2$ substrate, and comprised of layers of 50 Å Ti | 150 Å Pd | 160 Å IrMn(78) | 24 Å CoFe(80/20) | 18 Å Al plasma oxidized for 240 seconds | 3 Å CoFe(40/60) | 97 Å CoFe(80/20) | 200 Å Pd that, even at biases comparable to the projected barrier height (0.6 V), the magnetoresistance is still considerable (17%).

Although it is necessary to experimentally obtain magnetoresistance in MTJs having lower barrier heights, recently published experimental results relating to MTJs having barriers formed from boron nitride and strontium titanate and having barrier heights of 1 eV, which is half the barrier height of $Al_2O_3$, show large MR. See, for example, R. A. Lukashew et al., Patterned Co—BN—Co Spin Tunneling Structures, Physics Dept. Univ. Michigan, Ann Arbor, MI, MRS Spring Meeting 1999, San Francisco, Calif., in which a barrier formed from 13 Å of Boron Nitride and having a reported barrier height 1 eV and a reported change in resistance of over 20% at room temperature. Although 1 eV is not quite a sufficiently low enough a barrier, such experimental results indicate that a lowering of the barrier height with respect to 2 eV of $Al_2O_3$ does not pose a problem in realization of MTJs having high magnetoresistance.

An example of a low barrier $Al_2O_3$ system is disclosed by H. Tsuge et al., Magnetic tunnel junctions with in situ naturally-oxidized tunnel barrier, MRS Spring Meeting Proceedings, 1998. The disclosed fitted barrier thickness was 12 Å and the barrier height was 0.6–0.7 eV. The magnetoresistance was of the order of 12%. Thus, this result shows that MTJs having a barrier approaching 0.5 eV show sufficient degree of magnetoresistance for purposes of the present invention.

Theoretical first principles calculations support the idea that low barrier height materials show considerable MR in MTJs. For example, Butler et al., J.Appl.Phys. 81 (1997) 5518, disclose a calculation for a Fe—Ge—Fe structure for which magnetoresistance is expected. The expected barrier height for a Fe—Ge junction is about 0.5 eV based on Schottky barrier heights in metal-semiconductor systems, such as disclosed in Phys. Semiconductor devices, Sze, p.291. A barrier height of about 0.5 eV is the barrier height for the preferred embodiment of the present invention. Another example can be found in Maclaren et al., PRB 59 (1999) p.5470, in which numerical calculations show the possibility of magnetoresistance in Fe—ZnSe—Fe structures. Although not mentioned, the barrier height of Fe with ZnSe is expected to be on the order of 1 eV. See, for example, Phys. Semiconductor devices, Sze, p.291.

Another example of an MTJ structure for which the barrier height is predicted to be low (0.5 eV) is a $CrO_2$-$TiO_2$-$CrO_2$ system, in which $TiO_2$ forms a semiconducting barrier and $CrO_2$ forms a halfmetallic ferromagnet. This particular structure is described by A. M. Bratkovsky, PRB 56, 1997, p.1, in which a large magnetoresistance is predicted. Again, no mention is made of the barrier height, non-linearity or its use for intrinsic selectivity in an MRAM. The barrier height with $TiO_2$ is expected to be on the order of 0.5 eV.

Based on these experimental and theoretical indications, there is no fundamental theoretical limitation for obtaining MR values that are sufficiently high for read select purposes at the barrier heights projected for the present invention (0.4–1 eV). The absence of a series diode, series MTM or series FET removes the variability in signal output caused by large voltage drops in such selection devices. Consequently, for similar performance, the magnetoresistance value of the single NL-MTJ of the present invention is accordingly less critical. Because in the preferred embodiment of the present invention no diode is necessary, the response speed is higher because no there is no slow response caused by minority carrier storage associated with a p-n junction. Further, fabrication is practical because no semiconductor on metal growth is required, and fabrication requires fewer steps. Additionally, the signal output is greater because there is no large series resistance of a selection diode. Lastly, the present invention is less temperature dependent because a thermionic emission in a semiconductor diode results in a temperature dependent shift in turn-on voltage, and hence in a temperature dependent cell output making state determination difficult. The advantage over the use of an NLE in series with an MTJ is the facilitated preparation as well as the better selection ratio. An added advantage of the preferred embodiment of this invention over prior art in which a transistor is used as a switching element is the increased bit density.

An alternative embodiment of the present invention improves the signal/sneak current ratio by using an offset bias. For this alternative embodiment of the present invention, the unselected word lines are held at a bias voltage that is above the half-bias point. The current through the devices along the sense line is reduced and, hence, the sneak current that flows from the sense line is reduced. For example, referring to the curve 54 of FIG. 5B, the applied bias on the unselected word line (1.0 V) would be closer to the sense line voltage (0.6 V) than the half-bias point (0.5 V). The sneak current is then determined by the I(0.1 V) or only 0.5 $\mu$A times the n−1 unselected cells. The SSCR is 400, which allows even larger arrays than 100×100 and/or easier sensing. The unselected cells along the selected word line conduct a larger current than with the first embodiment of the present invention. Consequently, this embodiment dissipates higher power in the unselected cells.

For writing or assisted writing by a current through the MTJ, the required current through the MTJ is estimated to be on the order of 1 mA. Referring to FIG. 5B, the required bias across the 0.5 eV, 20 Å barrier will be about 0.72 V. The voltage drop across the unselected MTJs will be half of that, that is, 0.36 V. The current at this bias is 5 $\mu$A (from FIG. 6B), which is very small indeed. For an n=100 array, the sneak write current will be 0.5 mA, so the total write current will not be very much larger than the write current through the selected MTJ, and write selection can be considered excellent.

Of course, there are variations and modifications that can be implemented in the present invention. For example, the bit lines can be located below the memory cells and connected to the memory cell non-linear elements, while the word lines are located above the memory cells and connected to the MTJs. The bit value stored by the MTJ can be detected by applying a constant voltage bias and measuring the current. Alternatively, the state of a memory cell can be sensed by forcing a predetermined fixed current through the selected memory cell and detecting the voltage on the bit line, with a fixed voltage applied on the word line. This alternative approach, however, provides less efficient sensing than the sensing techniques described above.

While the present invention has been described in connection with the illustrated embodiments, it will be appreciated and understood that modifications may be made without departing from the true spirit and scope of the invention.

What is claimed is:

1. A non-linear magnetic tunnel junction storage element, comprising:
   a first ferromagnetic layer;
   a barrier layer; and
   a second ferromagnetic layer,
   the non-linear magnetic tunnel junction storage element having a non-linearity defined by a current having a first magnitude flowing through the non-linear magnetic tunnel junction storage element for a bias across the non-linear magnetic tunnel junction storage element of about 0.5 $V_A$ that is ten times or more smaller than a current having a second magnitude flowing through the non-linear magnetic tunnel junction storage element for a bias across the non-linear magnetic tunnel junction storage element of about 1 $V_A$, such that $V_A$ is an operating voltage of the non-linear magnetic tunnel junction storage element.

2. The non-linear magnetic tunnel junction storage element according to claim 1, wherein the operating voltage $V_A$ is about 1.0 Volt.

3. The non-linear magnetic tunnel junction storage element according to claim 1, wherein the barrier layer of the non-linear magnetic tunnel junction storage element is an insulating layer.

4. The non-linear magnetic tunnel junction storage element according to claim 3, wherein the barrier layer is formed from an insulating layer that, in combination with the first and second ferromagnetic layers, has a barrier height that is less than about 1 eV.

5. The non-linear magnetic tunnel junction storage element according to claim 4, wherein the insulating layer is formed from aluminum arsenide.

6. The non-linear magnetic tunnel junction storage element according to claim 1, wherein the barrier layer of the non-linear magnetic tunnel junction storage element is a semiconducting layer.

7. The non-linear magnetic tunnel junction storage element according to claim 6, wherein the barrier layer is formed from a semiconducting material layer that, in combination with the first and second ferromagnetic layers, has a barrier height that is less than about 1 eV.

8. The non-linear magnetic tunnel junction storage element according to claim 7, wherein the semiconducting material layer is formed from one of silicon, germanium and an oxidic semiconductor.

9. The non-linear magnetic tunnel junction storage element according to claim 8, wherein the oxidic semiconductor includes one of titanium dioxide and zinc oxide.

10. A non-volatile memory array, comprising:
    a substrate;
    a first plurality of electrically conductive traces formed on the substrate;
    a second plurality of electrically conductive traces formed on the substrate and overlapping first plurality of traces at a plurality of intersection regions; and
    a plurality of memory cells, each memory cell being located at an intersection region between one of the first plurality of traces and one of the second plurality of traces, at least one memory cell including a non-linear magnetic tunnel junction storage element, the non-linear magnetic tunnel junction storage element having at least a first ferromagnetic layer, a barrier layer and a second ferromagnetic layer, the non-linear magnetic tunnel junction storage element having a non-linearity defined by a current having a first magnitude flowing through the non-linear magnetic tunnel junction storage element for a bias across the non-linear magnetic tunnel junction storage element of about 0.5 $V_A$ that is ten times or more smaller than a current having a second magnitude flowing through the non-linear magnetic tunnel junction storage element for a bias across the non-linear magnetic tunnel junction storage element of about a 1 $V_A$, where $V_A$ is an operating voltage for a memory cell.

11. The non-volatile memory array according to claim 10, wherein the operating voltage $V_A$ is about 1.0 Volt.

12. The non-volatile memory array according to claim 10, wherein the barrier layer of the non-linear magnetic tunnel junction storage element is an insulating layer.

13. The non-volatile memory array according to claim 12, wherein the barrier layer is a insulating layer that, in combination with the first and second ferromagnetic layers, has a barrier height that is less than about 1 eV.

14. The non-volatile memory array according to claim 13, wherein the insulating layer is formed from aluminum arsenide.

15. The non-volatile memory array according to claim 10, wherein the barrier layer of the non-linear magnetic tunnel junction storage element is a semiconducting layer.

16. The non-volatile memory array according to claim 15, wherein the barrier layer is formed from a semiconducting material layer that, in combination with the first and second ferromagnetic layers, has a barrier height that is less than about 1 eV.

17. The non-volatile memory array according to claim 16, wherein the semiconducting material layer is formed from one of silicon, germanium and an oxidic semiconductor.

18. The non-volatile memory array according to claim 17, wherein the oxidic semiconductor includes one of titanium dioxide and zinc oxide.

19. A non-linear magnetic tunnel junction storage element, comprising:
a first ferromagnetic layer, a barrier layer formed by an insulating layer; and
a second ferromagnetic layer,
the non-linear magnetic tunnel junction storage element having a predetermined barrier thickness and a predetermined barrier height that produces a current-voltage non-linearity characteristic that is sufficient for reading and writing the non-linear magnetic tunnel junction storage element, and the insulating barrier layer, in combination with the first and second ferromagnetic layers, having a barrier height that is less than about 1.0 eV.

20. The non-linear magnetic tunnel junction storage element according to claim 19, wherein the non-linear magnetic tunnel junction storage element is part of a non-volatile memory array.

21. A non-linear magnetic tunnel junction storage element, comprising.
a first ferromagnetic layer,
a barrier layer formed by an insulating layer, and
a second ferromagnetic layers
the non-linear magnetic tunnel junction storage element having a predetermined barrier thickness and a predetermined barrier height that produces a current-voltage non-linearity characteristic that is sufficient for writing the non-linear magnetic tunnel junction storage element, and the insulating barrier layer, in combination with the first and second ferromagnetic layers, having a barrier height that is less than about 1.0 eV.

22. The non-linear magnetic tunnel junction storage element according to claim 21, wherein the non-linear magnetic tunnel junction storage element is part of a non-volatile memory array.

23. A non-linear magnetic tunnel junction storage element, comprising:
a first ferromagnetic layer;
a barrier layer, and
a second ferromagnetic layer formed by a semiconducting layer,
the non-linear magnetic tunnel junction storage element having a predetermined barrier thickness and a predetermined barrier height that produces a current-voltage non-linearity characteristic that is sufficient for reading and writing the non-linear magnetic tunnel junction storage element, and the semiconducting barrier layer, in combination with the first and second ferromagnetic layers, having a barrier height that is less than about 1 eV.

24. The non-linear magnetic tunnel junction storage element according to claim 23, wherein non-linear magnetic tunnel junction storage element is part of a non-volatile memory array.

25. A non-linear magnetic tunnel junction storage element, comprising:
a fist ferromagnetic layer,
a barrier layer; and
a second ferromagnetic layer,
the non-linear magnetic tunnel junction storage element having a predetermined barrier thickness and a predetermined barrier height that produces a current-voltage non-linearity characteristic that is sufficient for reading aid writing the non-linear magnetic tunnel junction storage element, the current-voltage non-linearity characteristic being defined by a current having a first magnitude flowing through the non-linear magnetic tunnel junction storage element for a bias across the non-linear magnetic tunnel junction storage element of about 0.5 VA that is ten times or more smaller than a current having a second magnitude flowing through the non-linear magnetic tunnel junction storage element for a bias across the non-linear magnetic tunnel junction storage element of about a 1 $V_A$, where $V_A$ is an operating voltage of the memory cell.

26. The non-linear magnetic tunnel junction storage element according to claim 25, wherein the operating voltage $V_A$ is about 1.0 Volt.

27. The non-linear magnetic tunnel junction storage element according to claim 25, wherein the non-linear magnetic tunnel junction storage element is part of a non-volatile memory array.

28. A non-linear magnetic tunnel junction storage element, comprising:
a first ferromagnetic layer,
a barrier layer formed by a semiconducting material; and
a second ferromagnetic layer,
the non-linear magnetic tunnel junction storage element having a predetermined barrier thickness and a predetermined barrier height that produces a current-voltage non-linearity characteristic that is sufficient for writing the non-linear magnetic tunnel junction storage element, the semiconducting material barrier layer, in combination with the first and second ferromagnetic layers, having a barrier height that is less than about 1 eV.

29. The non-linear magnetic tunnel junction storage element according to claim 28, wherein the non-linear magnetic tunnel junction storage element is part of a non-volatile memory array.

30. A non-linear magnetic tunnel junction storage element, comprising:

a first ferromagnetic layer;

a barrier layer, and a second ferromagnetic layer, the non-linear magnetic tunnel junction storage element having a predetermined barrier thickness and a predetermined barrier height that produces a current-voltage non-linearity characteristic that is sufficient for writing the non-linear magnetic tunnel junction storage element, the current-voltage non-linearity characteristic being defined by a current having a first magnitude flowing through the non-linear magnetic tunnel junction storage element for a bias across the non-linear magnetic tunnel junction storage element of about 0.5 $V_A$ that is ten times or more smaller than a current having a second magnitude flowing through the non-linear magnetic tunnel junction storage element for a bias across the non-linear magnetic tunnel junction storage element of about a 1 $V_A$, where $V_A$ is an operating voltage of the memory cell.

31. The non-linear magnetic tunnel junction storage element according to claim 30, wherein the operating voltage $V_A$ is about 1.0 Volt.

32. The non-linear magnetic tunnel junction storage element according to claim 30, wherein the non-linear magnetic tunnel junction storage element is part of a non-volatile memory array.

* * * * *